US005883787A

United States Patent [19]

Reier

[11] Patent Number: 5,883,787

[45] Date of Patent: Mar. 16, 1999

[54] FLOATING GUIDED CONNECTOR AND METHOD

[75] Inventor: Bart Reier, Raleigh, N.C.

[73] Assignee: Ericsson, Inc., Research Triangle Park, N.C.

[21] Appl. No.: 831,593

[22] Filed: Apr. 10, 1997

[51] Int. Cl.$^{6}$ .......... H05K 5/00

[52] U.S. Cl. .......... 361/752; 361/756; 439/929

[58] Field of Search .......... 361/728, 752, 361/748, 756, 796, 822, 814, 772, 776; 439/83, 680, 929

[56] References Cited

U.S. PATENT DOCUMENTS

| | | | |
|---|---|---|---|
| 4,781,626 | 11/1988 | Lazarchik | 439/680 |
| 5,186,633 | 2/1993 | Mosser, III | 439/83 X |
| 5,199,884 | 4/1993 | Kaufman et al. | 439/83 X |
| 5,220,270 | 6/1993 | Peickert | 439/929 X |
| 5,466,171 | 11/1995 | Bixler et al. | 439/680 X |

FOREIGN PATENT DOCUMENTS

| | | |
|---|---|---|
| 0 743 717 A | 11/1996 | European Pat. Off. . |
| 42 43 076 A | 6/1994 | Germany . |
| WO 95 35550 A | 12/1995 | WIPO . |

*Primary Examiner*—Leo P. Picard
*Assistant Examiner*—Jayprakash N. Gandhi
*Attorney, Agent, or Firm*—Nixon & Vanderhye PC

[57] ABSTRACT

A user accessible connector includes a contact support frame shaped to fit in an external housing, a spring contact attached to the contact support frame for contacting the apparatus PCB, and a guide pin attached to the contact support frame and having a fixed positional relationship with the spring contact. When secured to the external housing, the connector is laterally shiftable by a predetermined distance. The apparatus PCB is provided with a guide slot that is shaped to receive the guide pin of the connector. When mating the exterior housing with the PCB, a tapered surface of the guide pin effects shifting of the connector in the lateral direction to properly align the spring contacts with the PCB contact pads. Because the guide pin has a fixed positional relationship with the spring contacts and the guide slot has a similar fixed positional relationship with the PCB contact pads, when the guide pin is inserted in the PCB guide slot, the spring contacts are accurately aligned with the PCB contact pads.

19 Claims, 2 Drawing Sheets

FLOATING GUIDED CONNECTOR AND METHOD

BACKGROUND OF THE INVENTION

The present invention relates to a component mounted in an external housing of an electronic apparatus and, in particular, to a user accessible connector that is engageable with the apparatus printed circuit board (PCB) and aligned using a guide pin.

In electronic devices, in particular cellular phones, there are connectors mounted in the apparatus external housing that require both customer access and electrical contact to the apparatus PCB. The connection to the PCB must be accomplished reliably to ensure consistent and accurate electrical contact and to prevent shorting of the connector. This contact must also be accomplished in a manner that is cost effective and is suitable for large scale manufacturing, while minimizing use of valuable PCB area. The complexity of this problem is increased with the tolerance accumulations associated with an apparatus including a PCB mounted rigidly to one half of the apparatus housing and the connector secured in the other half of the apparatus housing.

There are several known methods to arrange such a connector in an electronic apparatus. One way is to solder the connector directly to the apparatus PCB. With this connection, the relationship between the PCB and the exterior surface is critical. Because the connector must be accessible by the user, the PCB surface must be relatively close to an external surface of the apparatus. Also with this arrangement, a large amount of valuable PCB space is occupied.

Another arrangement mounts the connector to an interior frame or shield, and the connector is cabled back to the PCB. Cabling is accomplished with either a flex cable or discrete wires. In this arrangement, however, additional costs are required for the cable itself and for a compatible connection on the PCB. Moreover, this arrangement is difficult to assemble.

In still another arrangement, a connector is mounted into the exterior housing and includes spring fingers or contacts that make contact to the apparatus PCB. This solution is effective in that it is mounted above the PCB in an area that is generally available for use (e.g., behind the battery) and thus, it does not occupy valuable PCB space. Moreover, there is no additional cost for a cable or suitable connector on the PCB to attach the cable since the spring contacts make electrical connection directly to contact pads on the PCB. Still further, the apparatus can be assembled in a "blind mate" condition, which reduces manufacturing costs.

A problem arises with this arrangement, however, with respect to tolerances. It is difficult to ensure that a connector, which is rigidly mounted in one-half of the housing, will always make reliable contact with the apparatus PCB, which may be rigidly mounted in the other half of the housing. Of course, one way to overcome the tolerance issues is to make larger components, such that the contacts can be spaced farther apart, and the pads on the PCB can be made larger. Such a design, however, is inconsistent with miniaturization goals.

SUMMARY OF THE INVENTION

It is therefore an object of the invention to provide a connector arrangement that overcomes the drawbacks associated with prior arrangements while maintaining a compact size. In the arrangement according to the invention, instead of the connector being rigidly mounted in one-half of the housing, it is mounted in such a way that it is able to "float" in a lateral direction. The connector is also provided with a guide pin that has a fixed positional relationship with the spring contacts of the connector. The mating PCB includes a guide slot therein that has a fixed positional relationship with the PCB contact pads. When the housing halves are assembled, the guide pin on the connector engages the guide slot on the PCB, and the connector shifts laterally such that the spring contacts are aligned with the PCB contact pads. By locating the spring contacts on the connector directly with a feature on the part it connects to, the additional assembly tolerances are eliminated. The resulting arrangement is inexpensive to manufacture, provides an accurate contact between the connector and PCB, and minimizes used PCB area while avoiding problems associated with tolerance stack-ups.

In a preferred embodiment, the objects of the invention are achieved by providing a user accessible connector mountable in an external housing of an electronic apparatus. The connector includes a contact support frame shaped to fit in the external housing, a spring contact attached to the contact support frame is for contacting the apparatus PCB, and a guide pin attached to the contact support frame and having a fixed positional relationship with the spring contacts.

In accordance with another aspect of the invention, there is provided an electronic apparatus including a housing enclosing apparatus components, a PCB disposed in the housing and including at least one contact pad, and a connector.

In this arrangement, the connector includes a contact support frame secured to the housing, a spring contact attached to the contact support frame and coupled with the PCB, and a guide pin attached to the contact support frame and having a fixed positional relationship with the spring contact. The housing preferably includes longitudinal securing structure formed therein for receiving the contact support frame and securing the support frame against longitudinal movement. The housing may further include lateral stops formed therein disposed adjacent longitudinal sides of the contact support frame and spaced a predetermined distance wider than a width of the contact support frame. The longitudinal securing structure preferably includes at least one securing post disposed adjacent a first lateral side of the contact support frame and an interior wall disposed adjacent a second lateral side of the contact support frame. An undercut may be attached to the interior wall to further secure the contact support frame. In this arrangement, the PCB preferably includes a guide slot therein sized to receive the guide pin, wherein the guide slot has a fixed positional relationship with the contact pad. The guide pin may include a tapered portion at a guide slot engaging end thereof. In this context, the tapered portion preferably includes a guide surface that aligns the spring contact and the PCB contact pad when attaching the connector to the PCB.

In accordance with yet another aspect of the invention, there is provided a method of securing a connector in an electronic apparatus. The method includes the steps of (a) attaching the connector to the housing, (b) substantially preventing longitudinal movement of the connector while permitting a predetermined amount of lateral movement, and (c) aligning, using the guide pin, the spring contact with the PCB contact pad.

BRIEF DESCRIPTION OF THE DRAWINGS

These and other aspects and advantages of the present invention will be described in detail with reference to the accompanying drawing, in which.

DETAILED DESCRIPTION OF PREFERRED EMBODIMENTS

Figure 1:
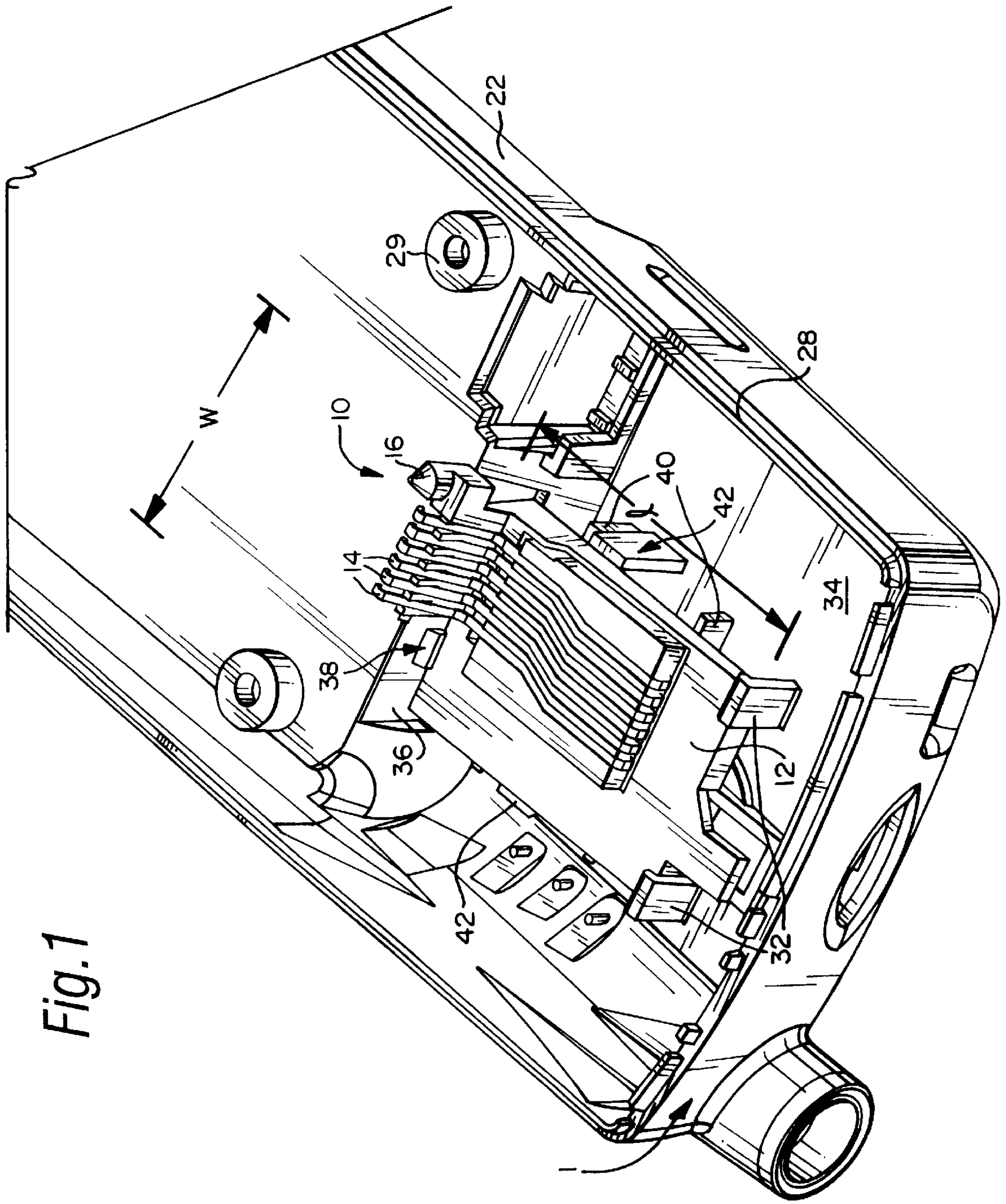
FIG. 1 is a perspective view of the connector half of the apparatus housing.

In the following detailed description, the connector arrangement and method will be described in conjunction with its application to a cellular phone. In this context, however, it should be noted that those of ordinary skill in the art will contemplate alternative applications of the subject matter according to the present invention, and the invention is not meant to be limited to the described and illustrated application.

Referring to the figures, the connector 10 according to the present invention includes a contact support frame 12, a plurality of spring contacts attached to the contact support frame 12, and a guide pin 16 attached to the contact support frame 12. The guide pin 16 has a fixed positional relationship with the spring contacts 14. In a preferred arrangement, the guide pin 16 is formed integral with the contact support frame 12 such that the contact support frame and guide pin can be molded in a single step operation. The spring contacts 14 are preferably attached to the connector 10 using a conventional heat staking operation.

An electronic apparatus such as a cellular phone incorporating the connector 10 according to the present invention includes a connector side housing 22 securing the connector 10, that is matable with a PCB side housing 24, securing the apparatus PCB 26. The housing sides 22, 24 can be mated in any known manner using, for example, mating ridges 28 and/or connecting apertures.

As explained above, when mating the housing sides 22, 24, it is essential to proper operation of the apparatus that accurate electrical contact be made between the spring contacts 14 of the connector 10 and the contact pads 30 of the PCB 26. To enable accurate alignment of the spring contacts 14 with the PCB contact pads 30, the connector 10 according to the present invention is secured in the connector side housing 22 as shown in FIG. 1. A pair of securing posts or snaps 32 are secured to an inside surface 34 of the connector side housing 22. The housing 22 also includes an interior wall 36 formed therein longitudinally spaced from the securing posts 32 and including an undercut 38 attached thereto. The securing posts 32 and undercut 38 include tapered surfaces at upper portions thereof to facilitate insertion of the connector 10. The securing posts 32 and the undercut 38 are spaced apart in the longitudinal direction (the Y direction) a distance substantially corresponding to the longitudinal length l of the connector 10. During insertion, the connector 10 deflects the securing posts 32 via the tapered upper surfaces to allow for insertion of the connector 10. When inserted, the connector 10 rests on a pair of supports 40 secured to the inside surface 34 of the connector side housing 22, and the securing posts 32 and the interior wall 36 are disposed adjacent opposite lateral sides of the contact support frame 12. The securing posts 32 and undercut 38 define shoulders that prevent movement of the connector 10 in the Z direction. The securing posts 32, the undercut 38 and the interior wall 36 define longitudinal securing structure that substantially prevents movement of the connector 10 in the longitudinal direction (the Y direction).

A pair of lateral stops 42 disposed on opposite longitudinal sides of the connector 10 are also attached to the inside surface 34 of the connector side housing 22. The lateral stops 42 are spaced a predetermined distance wider than a width w of the contact support frame 12. In this manner, the connector 10 is laterally shiftable (along the X direction) over a distance defined by the lateral stops. In a preferred embodiment, the lateral stops 42 are spaced apart about 1 mm wider than the width w of the contact support frame 12.

Figure 2:
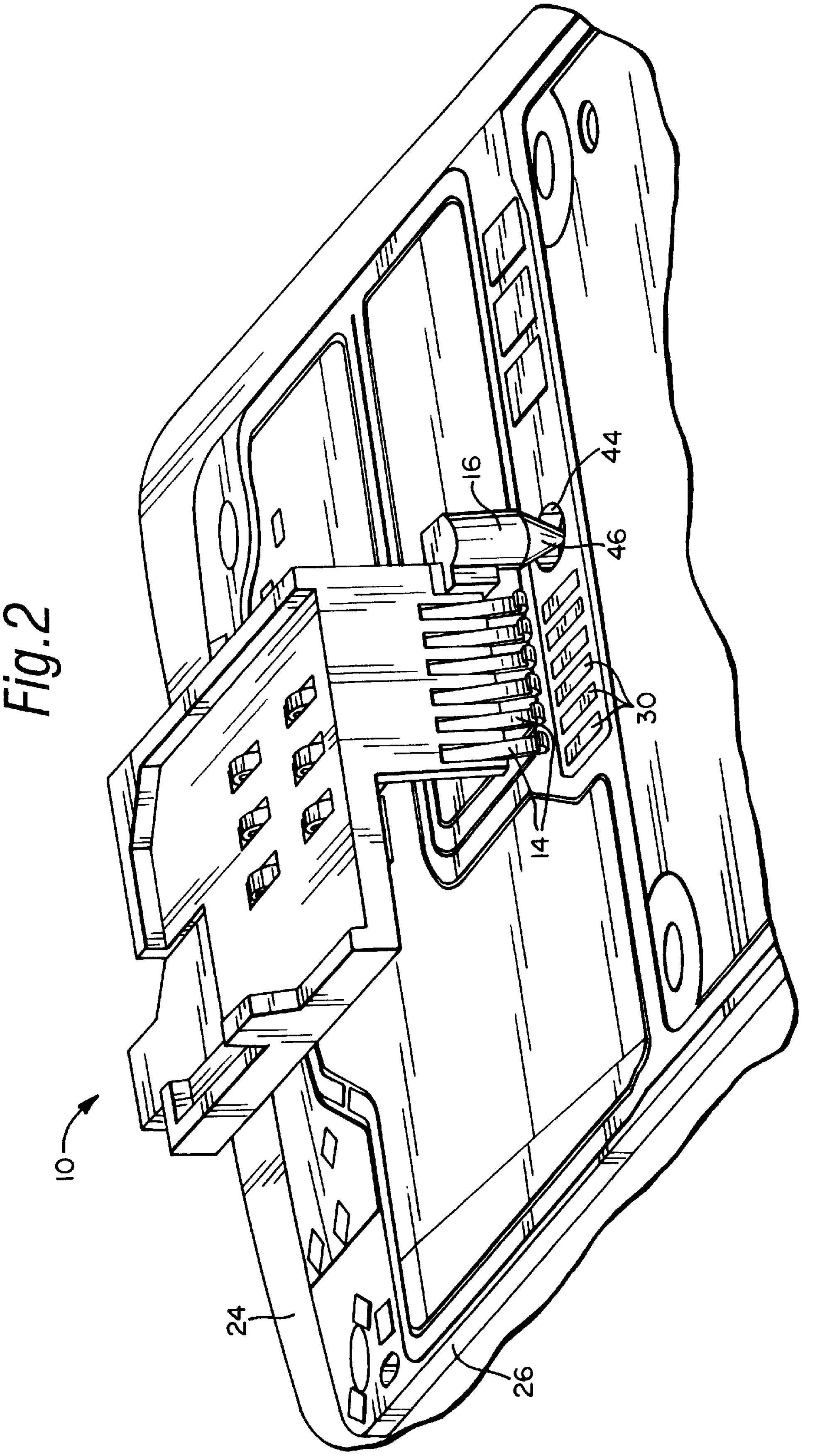
FIG. 2 is a perspective view of the apparatus PCB receiving the connector according to the present invention.

As shown in FIG. 2, the PCB 26 of the electronic apparatus is provided with a guide slot 44 therein that is sized to receive the guide pin 16. The guide slot 44 has a fixed positional relationship with the PCB contact pads 30, this relationship corresponding to the relationship between the guide pin 16 and the spring contacts 14.

The guide pin 16 has a tapered portion at a guide slot engaging end thereof including a guide surface 46. When mating the connector side housing 22 with the PCB side housing 24, if the spring contacts 14 of the connector 10 and the contact pads 30 of the PCB 26 are not properly aligned, the guide surface 46 of the guide pin 16 engages the guide slot 44 causing the connector 10 to shift laterally (along the X direction) to thereby align the spring contacts 14 with the contact pads 30. When the guide pin 16 is fully inserted into the guide slot 44, i.e., when the housings 22, 24 are completely mated, because of the fixed positional relationship between the guide pins 16 and the spring contacts 14 and between the guide slot 44 and the contact pads 30, the spring contacts 14 are accurately aligned with the contact pads 30.

By virtue of the structure according to the present invention, difficulties associated with tolerance stack-ups can be eliminated while ensuring alignment and electrical contact between connector contact members and PCB contact pads. Because the connector is laterally displaceable when secured in the connector side housing, a tapered guide pin engaging a guide slot in the PCB serves to align the spring contacts with the PCB contact pads. Additionally, the connector is simple and inexpensive to manufacture.

While the invention has been described in connection with what is presently considered to be the most practical and preferred embodiments, it is to be understood that the invention is not to be limited to the disclosed embodiments, but on the contrary, is intended to cover various modifications and equivalent arrangements included within the spirit and scope of the appended claims.

What is claimed is:

1. A user accessible component mountable in an external housing of an electronic apparatus, the component comprising:

a contact support frame shaped to fit in the external housing, said contact support frame being configured to be laterally displaceable relative to the external housing;

a spring contact attached to said contact support frame for contacting a printed circuit board of the apparatus; and a guide pin attached to said contact support frame, said guide pin having a fixed positional relationship with said spring contact.

2. A user accessible component according to claim 1, comprising a plurality of spring contacts attached to said support frame, wherein said guide pin has a fixed positional relationship with said plurality of spring contacts.

3. A user accessible component according to claim 1, wherein said guide pin is formed integral with said contact support frame.

4. An electronic apparatus comprising:

a housing enclosing apparatus components;

a printed circuit board disposed in said housing and including at least one contact pad; and a connector including:

a contact support frame secured to said housing, said contact support frame being laterally displaceable relative to said housing, a spring contact attached to said contact support frame and coupled with said printed circuit board, and a guide pin attached to said contact support frame, said guide pin having a fixed positional relationship with said spring contact.

5. An electronic apparatus according to claim 4, wherein said housing comprises longitudinal securing structure formed therein, said longitudinal securing structure receiving said contact support frame and securing said support frame against longitudinal movement.

6. An electronic apparatus according to claim 5, wherein said housing comprises lateral stops formed therein, said lateral stops being disposed adjacent longitudinal sides of said contact support frame and spaced a predetermined distance wider than a width of said contact support frame.

7. An electronic apparatus according to claim 6, wherein said longitudinal securing structure comprises at least one securing post disposed adjacent a first lateral side of said contact support frame and an interior wall disposed adjacent a second lateral side of said contact support frame.

8. An electronic apparatus according to claim 7, wherein said longitudinal securing structure further comprises an undercut attached to said interior wall.

9. An electronic apparatus according to claim 6, wherein said predetermined distance is about 1 mm.

10. An electronic apparatus according to claim 4, wherein said housing comprises lateral stops formed therein, said lateral stops being disposed adjacent longitudinal sides of said contact support frame and spaced a predetermined distance wider than a width of said contact support frame.

11. An electronic apparatus according to claim 10, wherein said predetermined distance is about 1 mm.

12. An electronic apparatus according to claim 4, wherein said printed circuit board comprises a guide slot therein sized to receive said guide pin, said guide slot having a fixed positional relationship with said at least one contact pad.

13. An electronic apparatus according to claim 12, wherein said guide pin comprises a tapered portion at a guide slot engaging end thereof.

14. An electronic apparatus according to claim 13, wherein said tapered portion comprises a guide surface, said guide surface, when attaching said connector to said printed circuit board, aligning said spring contact and said printed circuit board contact pad.

15. A method of securing a connector in an electronic apparatus, the electronic apparatus having a housing enclosing apparatus components and a printed circuit board disposed in the housing and including at least one contact pad, wherein the connector includes a contact support frame, a spring contact attached to the contact support frame and coupled with the printed circuit board, and a guide pin attached to the contact support frame, the guide pin having a fixed positional relationship with the spring contact, the method comprising:

(a) attaching the connector to the housing;

(b) substantially preventing longitudinal movement of the connector while permitting a predetermined amount of lateral movement; and (c) aligning, using the guide pin, the spring contact with the printed circuit board contact pad.

16. A method according to claim 15, wherein the predetermined amount is about 1 mm.

17. A method according to claim 15, wherein the printed circuit board includes a guide slot therein sized to receive the guide pin, the guide slot having a fixed positional relationship with said at least one contact pad, wherein step (c) is practiced by inserting the guide pin into the guide slot.

18. A method according to claim 15, wherein the printed circuit board includes a guide slot therein sized to receive the guide pin, and wherein the guide pin includes a tapered portion at a guide slot engaging end thereof, the tapered portion comprising a guide surface, wherein step (c) is practiced by guiding the guide pin into the guide slot with the guide surface.

19. A method according to claim 15, wherein step (c) is practiced by laterally shifting the connector.

* * * * *